United States Patent
Chu et al.

(10) Patent No.: US 12,176,407 B2
(45) Date of Patent: Dec. 24, 2024

(54) METHOD OF FORMING A TRANSISTOR DEVICE WITH A GATE STRUCTURE HAVING A PAIR OF RECESS REGIONS AND A RESISTIVE PROTECTION LAYER WITHIN

(71) Applicant: Taiwan Semiconductor Manufacturing Company, Ltd., Hsin-Chu (TW)

(72) Inventors: Chen-Liang Chu, Hsin-Chu (TW); Chien-Chih Chou, New Taipei (TW); Chih-Chang Cheng, Hsinchu (TW); Yi-Huan Chen, Hsin Chu (TW); Kong-Beng Thei, Pao-Shan Village (TW); Ming-Ta Lei, Hsin-Chu (TW); Ruey-Hsin Liu, Hsin-Chu (TW); Ta-Yuan Kung, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 127 days.

(21) Appl. No.: 17/874,486

(22) Filed: Jul. 27, 2022

(65) Prior Publication Data

US 2022/0367655 A1 Nov. 17, 2022

Related U.S. Application Data

(62) Division of application No. 16/929,640, filed on Jul. 15, 2020, now Pat. No. 11,444,169.
(Continued)

(51) Int. Cl.
*H01L 21/28* (2006.01)
*H01L 21/285* (2006.01)
(Continued)

(52) U.S. Cl.
CPC .. *H01L 29/42376* (2013.01); *H01L 21/28114* (2013.01); *H01L 21/28123* (2013.01);
(Continued)

(58) Field of Classification Search
CPC ......... H01L 21/28123; H01L 29/42372–4238; H01L 29/42384; H01L 29/7856;
(Continued)

(56) References Cited

U.S. PATENT DOCUMENTS 6,307,237 B1 10/2001 Erstad
10,141,400 B2 * 11/2018 Lee .................... H01L 27/092
(Continued)

FOREIGN PATENT DOCUMENTS

KR 20040067015 A 7/2004
WO WO-2016062358 A1 * 4/2016 ....... H01L 21/28052

OTHER PUBLICATIONS

Non-Final Office Action dated Aug. 23, 2021 for U.S. Appl. No. 16/929,640.
(Continued)

*Primary Examiner* — Younes Boulghassoul
(74) *Attorney, Agent, or Firm* — Eschweiler & Potashnik, LLC

(57) ABSTRACT

A method to form a transistor device with a recessed gate structure is provided. In one embodiment, a gate structure is formed overlying a device region and an isolation structure. The gate structure separates a device doping well along a first direction with a pair of recess regions disposed on opposite sides of the device region in a second direction perpendicular to the first direction. A pair of source/drain regions in is formed the device region on opposite sides of the gate structure. A sidewall spacer is formed extending along sidewalls of the gate structure, where a top surface of the sidewall spacer is substantially flush with the top surface
(Continued)

of the gate structure. A resistive protection layer is then formed on the sidewall spacer and covering the pair of recess regions.

20 Claims, 15 Drawing Sheets

Related U.S. Application Data

(60) Provisional application No. 62/982,700, filed on Feb. 27, 2020.

(51) Int. Cl.
| | | |
|---|---|---|
| *H01L 21/762* | (2006.01) | |
| *H01L 29/06* | (2006.01) | |
| *H01L 29/08* | (2006.01) | |
| *H01L 29/423* | (2006.01) | |
| *H01L 29/45* | (2006.01) | |
| *H01L 29/49* | (2006.01) | |
| *H01L 29/66* | (2006.01) | |
| *H01L 29/78* | (2006.01) | |

(52) U.S. Cl.
CPC .. *H01L 21/28518* (2013.01); *H01L 21/76224* (2013.01); *H01L 29/0653* (2013.01); *H01L 29/0847* (2013.01); *H01L 29/4238* (2013.01); *H01L 29/45* (2013.01); *H01L 29/4933* (2013.01); *H01L 29/4983* (2013.01); *H01L 29/66492* (2013.01); *H01L 29/665* (2013.01); *H01L 29/6659* (2013.01); *H01L 29/7833* (2013.01)

(58) Field of Classification Search
CPC ....... H01L 21/28114; H01L 21/823456; H01L 21/82385; H01L 29/4983; H01L 21/76224; H01L 21/76232; H01L 29/665; H01L 29/66507; H01L 21/28518; H01L 21/28052

See application file for complete search history.

(56) References Cited

U.S. PATENT DOCUMENTS

| | | | |
|---|---|---|---|
| 2010/0117148 A1 | 5/2010 | Kim et al. | |
| 2010/0148252 A1 | 6/2010 | Chang | |
| 2010/0320529 A1* | 12/2010 | Dong | H01L 29/1041 257/E21.409 |
| 2011/0175141 A1 | 7/2011 | Lim et al. | |
| 2011/0204451 A1* | 8/2011 | Seo | H01L 29/0653 438/296 |
| 2012/0003805 A1* | 1/2012 | Bang | H01L 21/76232 257/E21.546 |
| 2012/0280291 A1* | 11/2012 | Lee | H01L 29/1041 257/288 |
| 2013/0288445 A1 | 10/2013 | Ueda et al. | |
| 2017/0200649 A1* | 7/2017 | Yeo | H01L 29/7833 |
| 2019/0115260 A1* | 4/2019 | Hsiao | H01L 29/4238 |
| 2019/0131414 A1* | 5/2019 | Cheng | H01L 29/4238 |
| 2019/0148375 A1* | 5/2019 | Lin | H01L 21/76224 257/394 |

OTHER PUBLICATIONS

Final Office Action dated Feb. 28, 2022 for U.S. Appl. No. 16/929,640.
Notice of Allowance dated May 6, 2022 for U.S. Appl. No. 16/929,640.

* cited by examiner

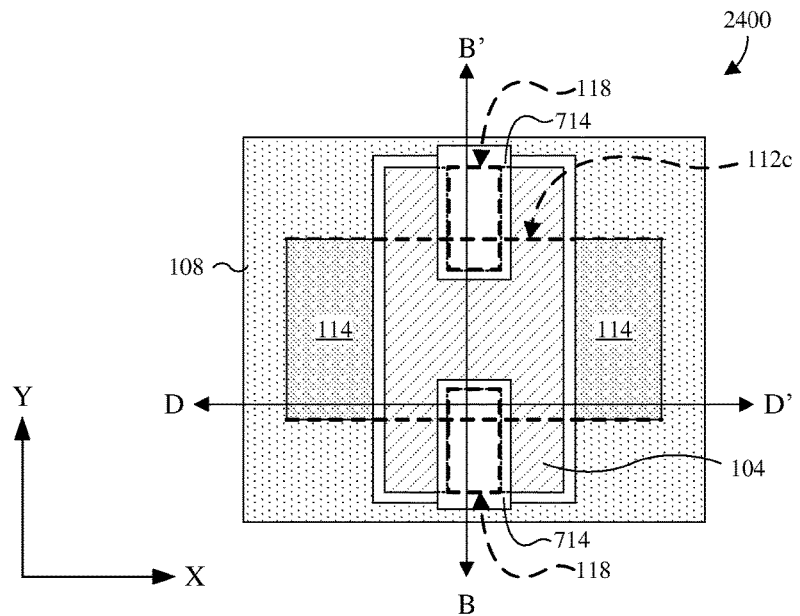
Fig. 24
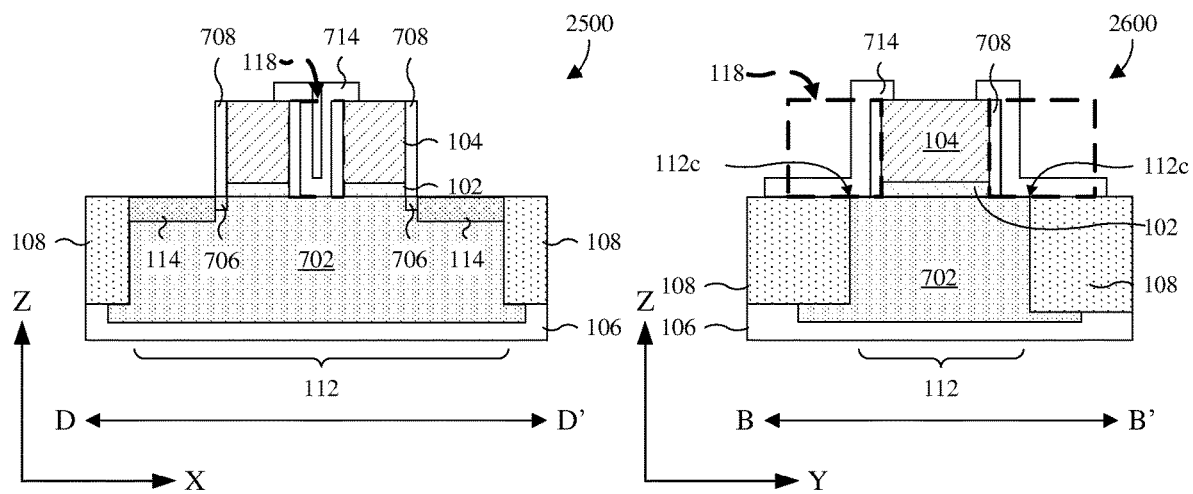
Fig. 25 Fig. 26

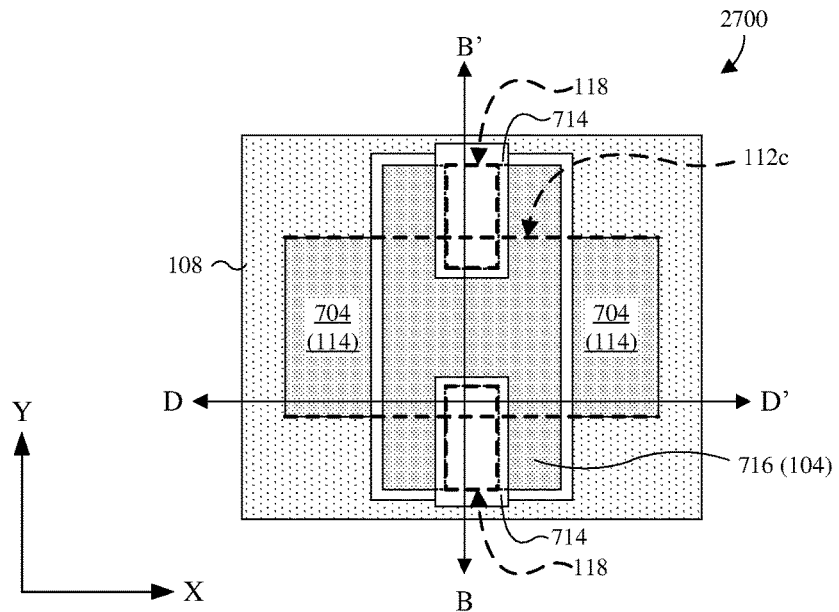
Fig. 27
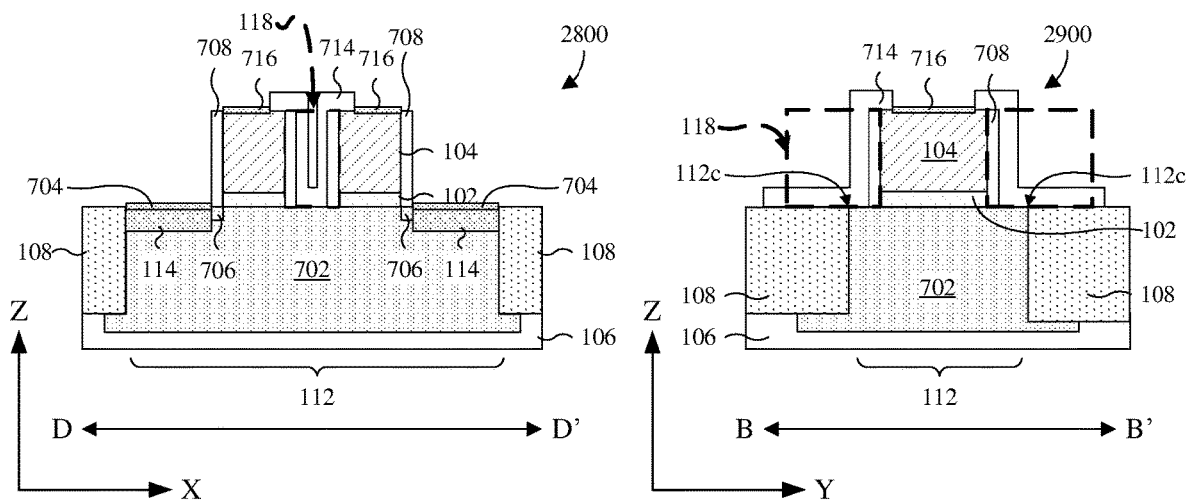
Fig. 28  Fig. 29

METHOD OF FORMING A TRANSISTOR DEVICE WITH A GATE STRUCTURE HAVING A PAIR OF RECESS REGIONS AND A RESISTIVE PROTECTION LAYER WITHIN

REFERENCE TO RELATED APPLICATIONS

This Application is a Divisional of U.S. application Ser. No. 16/929,640, filed on Jul. 15, 2020, which claims the benefit of U.S. Provisional Application No. 62/982,700, filed on Feb. 27, 2020. The contents of the above-referenced Patent Applications are hereby incorporated by reference in their entirety.

BACKGROUND

The semiconductor integrated circuit (IC) industry has experienced exponential growth. Technological advances in IC materials and designs have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 may illustrate some more detailed embodiments of the transistor device of FIGS. 1A-1B.

FIGS. 11-34 illustrate a series of views of some embodiments of a method for manufacturing a transistor device with a recessed gate structure.

FIG. 35 may illustrate some embodiments of the method of FIGS. 11-34.

DETAILED DESCRIPTION

Figure 1A:
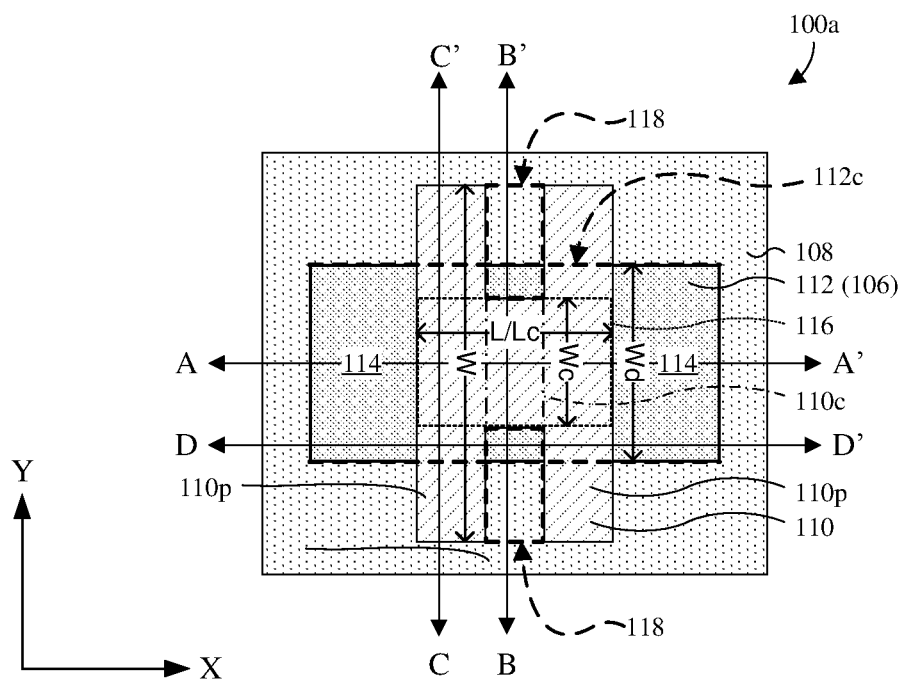
FIG. 1A illustrates a top view of some embodiments of a transistor device with a recessed gate structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some transistor devices comprise a semiconductor substrate and a shallow trench isolation (STI) structure. The STI structure is over and sunken into the semiconductor substrate to demarcate a device region of the semiconductor substrate. Further, the device region comprises a pair of source/drain regions spaced apart by a channel region. A gate structure overlies the channel region and comprises a gate dielectric layer separating a gate electrode from the channel region. The channel region is a selective conductor that allows current flowing from one of the source/drain regions to another one of the source/drain regions when sufficient biases are applied on the gate electrode and the pair of source/drain regions.

One of the challenges with the above transistor devices is the corner effect. At an interface region of the STI structure and the device region, doping concentrations of doped regions such as the source/drain regions and the channel region are not as uniform as inner portions of the device region, and a doping concentration of the interface region is usually smaller than that of the inner portions. Thus, a so-called corner transistor device is formed at the interface region, where the source/drain regions and the channel region may have a less doping concentration or a non-uniform doping distribution and thus generate a different transistor performance curve that has a smaller threshold voltage and a smaller drain current. Adding this performance curve of the corner transistor device to the performance curve of the inner portions of the device region, the transistor device might suffer a double-hump drain current versus gate voltage (IDVG) curve. As a result, the transistor device suffers a reduced device threshold voltage and more noise.

One method to reduce the double-hump IDVG curve problem is to add extra implant at the interface region of the STI structure and the device region to increase the corner threshold voltage and thus targeting to maintain a stable device threshold voltage. However, considering process margin and device performance, this extra implant needs enough window size, which becomes quite difficult for short channel devices. In addition, forming the extra implant needs extra masks, which increases processing cost and complexity.

In view of the above, various embodiments of the present application are directed towards a transistor device with a recessed gate structure that reduces or even eliminates the corner effect or the double-hump IDVG curve problem, and an associated method of manufacture. In some embodiments, a device region of the transistor device is disposed in a semiconductor substrate and surrounded by an isolation structure. A pair of source/drain regions is disposed in the device region and laterally spaced apart one from another. A gate structure is disposed between the pair of source/drain regions overlying the device region and is configured to control carriers (electrons and holes) flowing between the pair of source/region regions by applying a gate bias. A channel region is defined functionally as a region of the device region underneath the gate structure. The channel region is a selective conductor that allows current flowing from one of the source/drain regions to another one of the source/drain regions when sufficient biases are applied on the gate electrode and the pair of source/drain regions. The channel region has a channel length extending in a first direction from one of the source/drain regions to another one of the source/drain regions. The channel region has a channel width extending in a second direction perpendicular to the first direction from one side of the gate structure to an opposite side of the gate structure. The gate structure comprises a pair of recess regions on opposite sides of the device region in the second direction. In some embodiments, the pair of recess regions respectively overlying an interface region of the isolation structure and the device region. By having the recess regions, the gate structure is cut off at the interface region and thus no channel is built at the interface region for carriers to transfer through when a sufficient gate bias is applied. Thereby, the corner device at the interface region is disabled, and the corner effect and the double-hump IDVG curve problem are avoided or at least reduced. Additionally, the disclosed formation method of the recessed gate structure is a low cost, low complexity process because the recess regions are formed as a result of an improved gate layout without involving additional masking process.

FIG. 1A illustrates a top view 100a of a transistor device with a recessed gate structure according to some embodiments. The transistor device may be, for example, a field-effector transistor (FET), such as a metal-oxide-semiconductor (MOS) FET device, a heterostructure FET, or any other application transistor devices that use a gate structure to control the conductivity of or carriers flowing through an underneath channel region. As illustrated, in some embodiments, an isolation structure 108 encloses a device region 112 of a semiconductor substrate 106. The isolation structure 108 and the device region 112 meet at an interface region 112c. In some embodiments, the interface region 112c has a generally ring-shaped layout. A "generally" ring-shaped layout is similar to a ring-shaped layout, except it is not limited to circular inner and outer sidewalls. For example, a generally ring-shaped layout may be a square ring-shaped layout. The isolation structure 108 may be, for example, a shallow trench isolation (STI) region or a deep trench isolation (DTI) region. A pair of source/drain regions 114 is disposed in the device region 112 and laterally spaced one from another in a first direction (labeled as a "X" direction in figures). A gate structure 110 overlies the device region 112 and the isolation structure 108 and is arranged between the pair of source/drain regions 114. The gate structure 110 comprises a pair of recess regions 118 disposed on opposite sides of the device region 112 in a second direction (labeled as a "Y" direction in figures) perpendicular to the first direction. In some embodiments, the pair of recess regions 118 may respectively have a rectangular shape.

In some embodiments, the gate structure 110 has an H-shaped layout, as shown by FIG. 1A. The gate structure 110 may have a pair of peripheral gate segments 110p and a central gate segment 110c. The peripheral and central gate segments 110p, 110c may be line shaped. The peripheral gate segments 110p extend laterally in parallel in the Y direction, from the first end of the gate structure 110 to the second end of the gate structure 110. The peripheral gate segments 110p respectively cover the interface region 112c. The central gate segment 110c is between the peripheral gate segments 110p and extends laterally in the X direction from one of the peripheral gate segments 110p to another one of the peripheral gate segments 110p. The central gate segment 110c overlies an inner region of the device region 112 not crossing the interface region 112c. In some embodiments, the recess regions 118 are at a length-wise center of the gate structure 110 (i.e., at a center of a gate length L of the gate structure 110). Further, the recess regions 118 are respectively on opposite sides of the gate structure 110 and respectively overlie the interface region 112c. In some embodiments, the recess regions 118 are laterally spaced along a gate width W of the gate structure 110. Further, in some embodiments, the recess regions 118 each have a side that is open, and three sides defined by the gate structure 110.

A channel region 116 is defined functionally as a region of the device region 112 laterally between the source/drain regions 114 and underneath the gate structure 110. The channel region 116 is a selective conductor that allows current flowing from one of the source/drain regions 114 to another one of the source/drain regions 114 when sufficient biases are applied on the gate structure 110 and the pair of source/drain regions 114. In some embodiments, the source/drain regions 114 and the channel region 116 are doped regions of the semiconductor substrate 106 having opposite doping types. For example, the channel region 116 may be p-type and the source/drain regions 114 may be n-type, or vice versa. The channel region 116 has a channel length Lc extending in the X direction and equal to or substantially equal to the gate length L. In some embodiments, the channel region 116 may extend from one of the source/drain regions 114 to another one of the source/drain regions 114. The channel region 116 has a channel width Wc extending in the Y direction from one side of the gate structure 110 to an opposite side of the gate structure 110.

The channel width Wc of the channel region 116 is controlled by the narrowest portion of the gate structure 110, which is the central gate segment 110c of the gate structure 110 in the presented embodiments. Thus, the channel width Wc is smaller than a device width Wd of the device region 112 in the Y direction due to the arrangement of the recess regions 118, and the channel region 116 is recessed back from the interface region 112c. In some embodiments, the source/drain regions 114 respectively has a width in the second direction equal to or substantially equal to the device with Wd or at least greater than the channel width Wc. By arranging the recess regions 118 to cut off the gate structure 110 overlying the interface region 112c between the pair of source/drain regions 114, the channel region 116 is limited to an inner portion of the device region 112 in the Y direction and recessed away from the interface region 112c. The corner device at the interface region 112c is disabled since no channel is built at the interface region 112c for carriers to transfer through even when a sufficient gate bias is applied. As such, the corner effect and the double-hump IDVG curve problem are avoided or at least reduced.

Figure 1B:
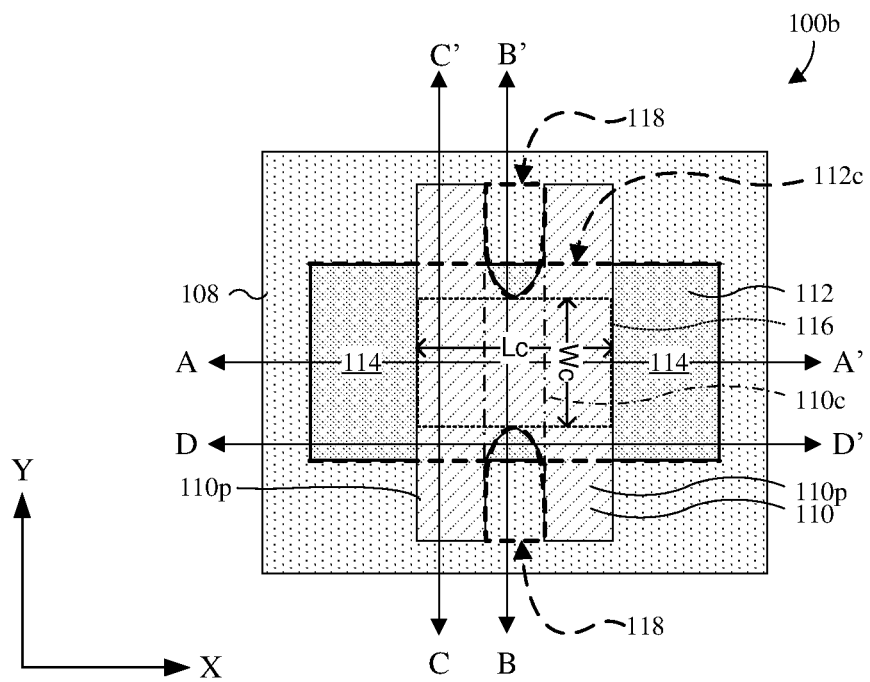
FIG. 1B illustrates a top view of some alternative embodiments of a transistor device with a recessed gate structure.

FIG. 1B illustrates a top view 100b of a transistor device with a recessed gate structure according to some embodiments alternative to FIG. 1A. Features of FIG. 1B that are common to FIG. 1A is herein incorporated. Besides, the pair of recess regions 118 may respectively have an X-shaped layout with curved recess regions 118, or other applicable layouts with a pair of longer peripheral gate segments 110p connected by a shorter central gate segment 110c. In some further embodiments, the pair of recess regions 118 may respectively have a concave curved perimeter, as shown by FIG. 1B. Alternative to what is illustrated in FIG. 1A, in FIG. 1B, the peripheral and central gate segments 110p, 110c may have curved ends (see the central gate segment 110c) or curved sidewalls (see the peripheral gate segments 110p) adjusting the curved perimeter of the recess regions 118. Curved perimeter of the recess regions 118 may leave less residue during the patterning of the gate structure 110 compared to the residue possibly left in rigid corners. In addition, the X-shaped layout of the gate structure 110 results an increasing cut-off from an inner region to a boundary such that effect of the boundary device can be minimized while maintaining performance of the inner transistor device. Similar to FIG. 1A, in FIG. 1B, the peripheral gate segments 110p extend laterally in parallel in the Y direction, from the first end of the gate structure 110 to the second end of the gate structure 110 and respectively cover the interface region 112c. The central gate segment 110c bridges the peripheral gate segments 110p in the X direction, overlies an inner region of the device region 112, and is recessed back from the interface region 112c in the Y direction. By arranging the recess regions 118 to cut off the gate structure 110 and to expose a portion of the interface region 112c between the pair of source/drain regions 114, the channel region 116 is limited to an inner portion of the device region 112 in the Y direction and recessed away from the interface region 112c. The corner device at the interface region 112c is disabled, and the corner effect and the double-hump IDVG curve problem are avoided or at least reduced.

Figure 2:
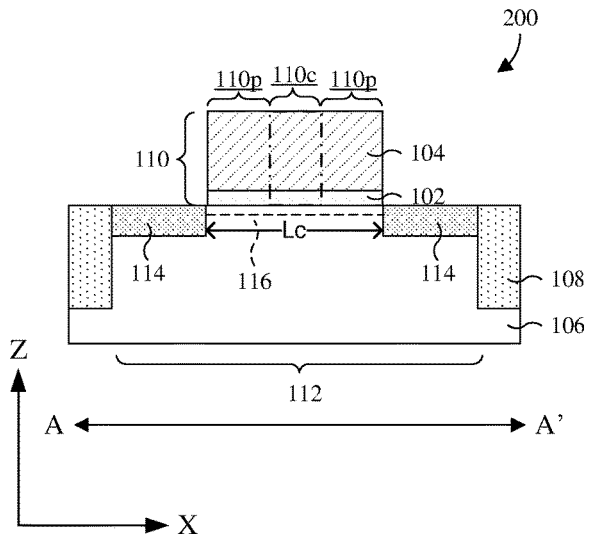
FIGS. 2-5 illustrate various cross-sectional views of some embodiments of the transistor device of FIGS. 1A-1B.
Figure 3:
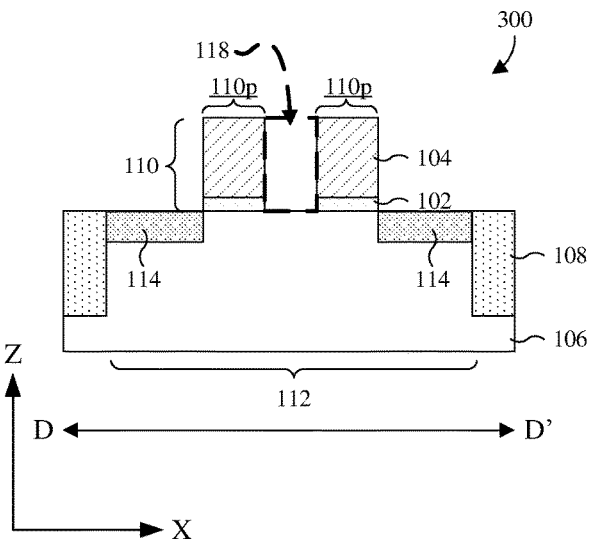
Figure 4:
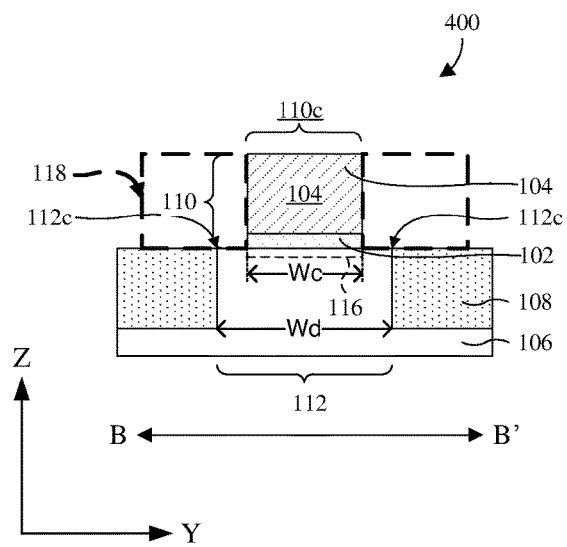
Figure 5:
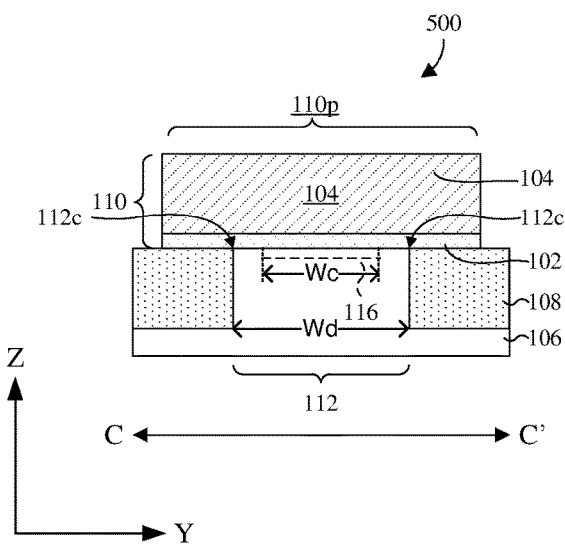

FIGS. 2-5 illustrate various cross-sectional views of a transistor device with a recessed gate structure according to some embodiments. In the X direction, FIG. 2 shows a cross-sectional view 200 along line A-A', and FIG. 3 shows a cross-sectional view 300 along line D-D' of the transistor device of FIG. 1A or FIG. 1B according to some embodiments. In the Y direction, FIG. 4 shows a cross-sectional view 400 along line B-B', and FIG. 5 shows a cross-sectional view 500 along line C-C' of the transistor device of FIG. 1A or FIG. 1B according to some embodiments. As illustrated, in some embodiments, the isolation structure 108 is disposed over and extends into the semiconductor substrate 106 and demarcates the device region 112 of the semiconductor substrate 106. The semiconductor substrate 106 may be, for example, a bulk semiconductor substrate, such as a bulk silicon substrate of monocrystalline silicon and may include varies doping wells and dielectric layers. The pair of source/drain regions 114 is disposed over the device region 112. The gate structure 110 overlies the semiconductor substrate 106. The gate structure 110 may comprise a gate dielectric layer 102 separating a gate electrode 104 from the device region 112. The pair of recess regions 118 is defined by the gate electrode 104 and, in some embodiments, the gate dielectric layer 102. The recess regions 118 may extend vertically through the gate structure 110, from top to bottom, and extend laterally into opposite sides of the gate structure 110. The gate electrode 104 and the gate dielectric layer 102 may be stacked with sidewalls vertically flushed. The gate dielectric layer 102 may be, for example, silicon dioxide, silicon nitride, a high κ dielectric, some other dielectric, or a combination of the foregoing. As used herein, a high κ dielectric layer is a dielectric with a dielectric constant κ greater than about 3.9, 5, 10, 15, or 20. The gate electrode 104 may be, for example, doped polysilicon, metal, or some other conductive material.

Further, the gate dielectric layer 102 and the gate electrode 104 are stacked on the device region 112, extend respectively from one of the source/drain regions 114 and to another one of the source/drain regions 114, and cover the channel region 116 in length along the X direction, as illustrated by the cross-sectional view 200 of FIG. 2 along line A-A'. Further yet, the gate dielectric layer 102 and the gate electrode 104 define the peripheral gate segments 110p extending continuously respectively from and to the isolation structure 108 on opposite sides of the device region 112, which respectively cover the interface region 112c, as illustrated by the cross-sectional view 500 of FIG. 5 along line C-C'. Further yet, the gate dielectric layer 102 and the gate electrode 104 define the recess regions 118 laterally between the peripheral gate segments 110p and exposing the device region 112 underneath the recess regions 118, as illustrated by the cross-sectional view 300 of FIG. 3 along line D-D'. Further yet, the gate dielectric layer 102 and the gate electrode 104 define the central gate segment 110c laterally between the peripheral gate segments 110p, which covers the channel region 116 in width along the Y direction, as illustrated by the cross-sectional view 400 of FIG. 4 along line B-B'. By having the recess regions 118 to cut off the gate structure 110 near the interface region 112c (see FIG. 3 where the peripheral gate segments 110p are separated by the recess regions 118 in the X direction and FIG. 4 where the interface region 112c is exposed from the central gate segment 110c in the Y direction), the channel region 116 is limited to an inner portion of the device region 112 in the Y direction and recessed away from the interface region 112c. Therefore, the corner device at the interface region 112c is disabled, and the corner effect and the double-hump IDVG curve problem are avoided or at least reduced.

Figure 6:
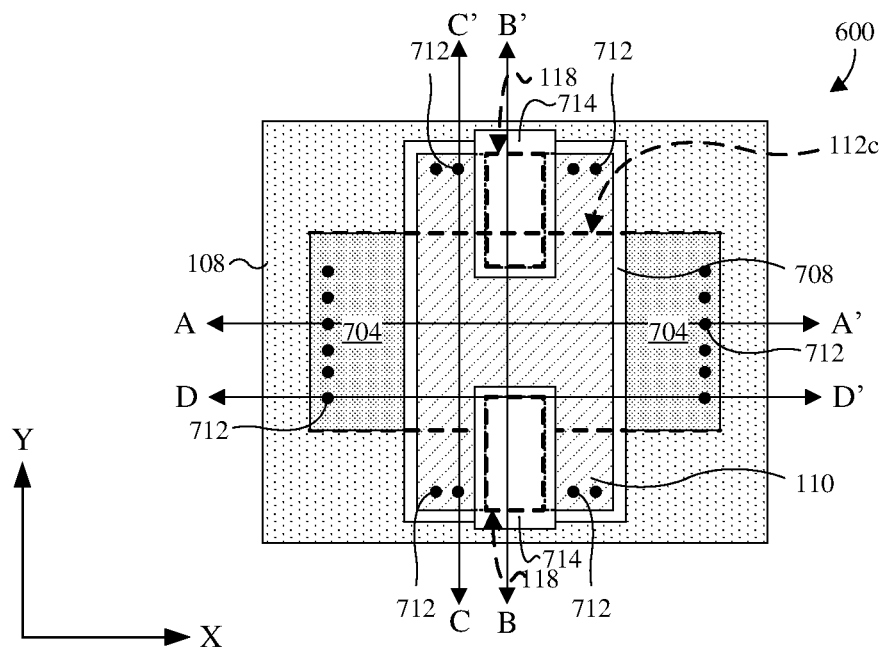
FIG. 6 illustrates a top view of some further embodiments of a transistor device with a recessed gate structure.

FIG. 6 illustrates a top view 600 of a transistor device with a recessed gate structure according to some further embodiments. FIG. 6 may illustrate some more detailed embodiments of the transistor device of FIGS. 1A-1B. As illustrated, a sidewall spacer 708 extends laterally along sidewalls of the gate structure 110 and to enclose the gate structure 110. In some embodiments, a resistive protection layer 714 is disposed on opposite sides of the gate structure 110 covering the pair of the recess regions 118. Further, a pair of silicide layers 704 are laterally spaced by the gate structure 110 and respectively on opposite sides of the gate structure 110. Further yet, contact vias 712 overlie and contact the gate structure 110 and the silicide layers 704. The sidewall spacer 708 and the resistive protection layer 714 may comprise the same or different materials, and may be, for example, silicon dioxide, silicon nitride, some other dielectric, or a combination of the foregoing.

Figure 7:
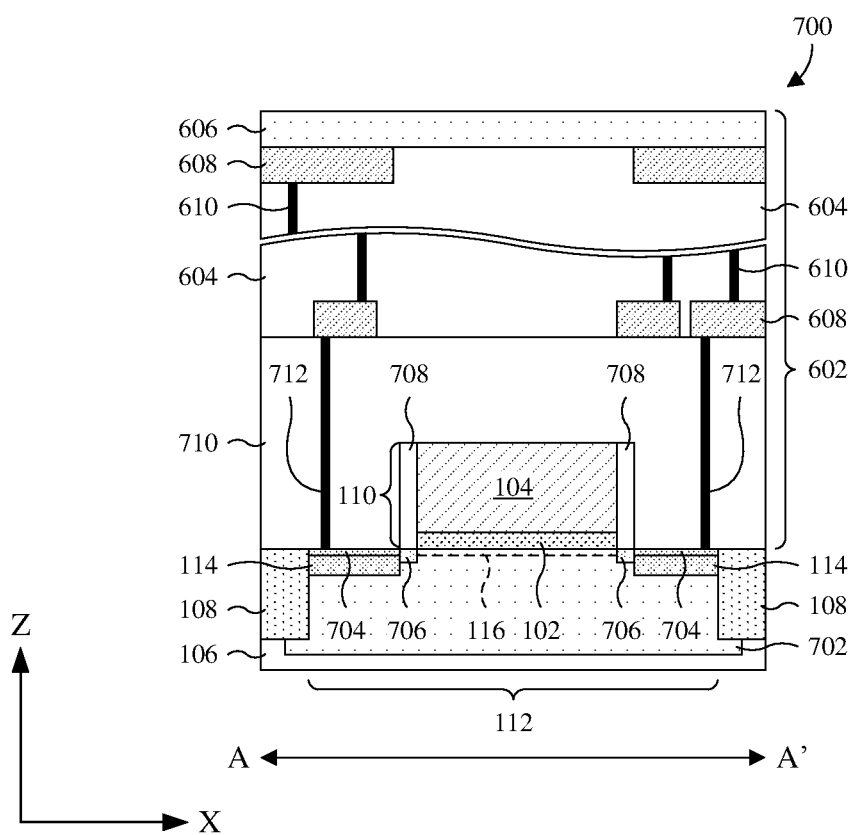
FIGS. 7-10 illustrate various cross-sectional views of some embodiments of the transistor device of FIG. 6.
Figure 8:
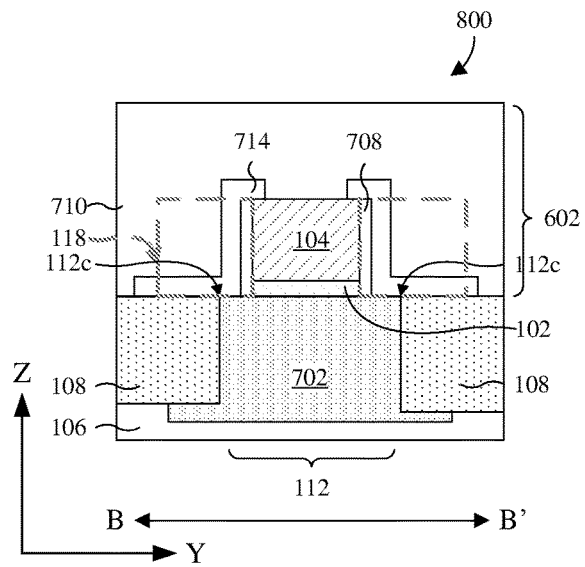
Figure 9:
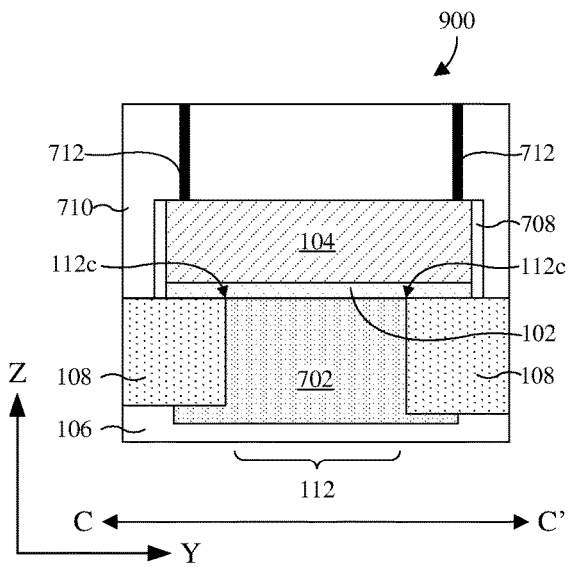
Figure 10:
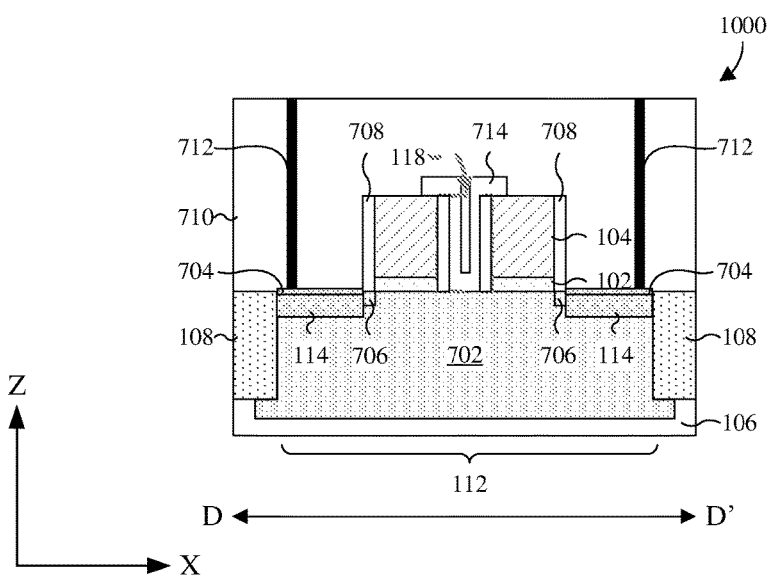

FIGS. 7-10 illustrate various cross-sectional views 700-1000 of some embodiments of the transistor device of FIG. 6. FIG. 7 may, for example, be taken along line A-A' of FIG. 6 in the X direction. FIG. 8 may, for example, be taken along line B-B' of FIG. 6 in the Y direction. FIG. 9 may, for example, be taken along line C-C' of FIG. 6 in the Y direction. FIG. 10 may, for example, be taken along line D-D' of FIG. 6 in the X direction.

As illustrated by the cross-sectional view 700 of FIG. 7, in some embodiments, a doping well 702 is disposed in the device region 112 of the semiconductor substrate 106. Further, in some embodiments, the doping well 702 underlies the isolation structure 108. The doping well 702 is a region of the semiconductor substrate 106 with a p-type or n-type doping, which may, for example, be opposite that of the source/drain regions 114. In some embodiments, the source/drain regions 114 and the channel region 116 are in the doping well 702. Further, in some embodiments, the source/drain regions 114 are respectively covered by the pair of silicide layers 704, and/or respectively adjoin a pair of lightly-doped drain (LDD) extensions 706 between the source/drain regions 114. The silicide layers 704 may be, for example, nickel silicide. The LDD extensions 706 have the same doping type as the source/drain regions 114 and may be, for example, doped regions of the semiconductor substrate 106 that are lightly doped relative to the source/drain regions 114.

In some embodiments, the sidewall spacer 708 lines opposite sidewalls of the gate electrode 104 to space the opposite sidewalls of the gate electrode 104 from the source/drain regions 114. Further, in some embodiments, the sidewall spacer 708 further lines opposite sidewalls of the gate dielectric layer 102 to space the opposite sidewalls of the gate dielectric layer 102 from the source/drain regions 114. Further yet, in some embodiments, the sidewall spacer 708 overlaps the LDD extensions 706. The sidewall spacer 708 may be, for example, silicon dioxide, silicon nitride, some other dielectric, or a combination of the foregoing.

In some embodiments, an interlayer dielectric (ILD) layer 710 covers the gate electrode 104, the sidewall spacer 708, the silicide layers 704, the source/drain regions 114, the doping well 702, the isolation structure 108, the semiconductor substrate 106, or a combination of the foregoing. Further, in some embodiments, contact vias 712 extends through the ILD layer 710, to the source/drain regions 114 and/or to the silicide layers 704. The ILD layer 710 may be, for example, silicon dioxide, silicon nitride, a low κ dielectric, some other dielectric, or a combination of the foregoing. As used herein, a low κ dielectric is a dielectric with a dielectric constant κ less than about 3.9, 3, 2, or 1. The contact vias 712 may be, for example, tungsten, copper, aluminum copper, aluminum, or some other metal.

In some embodiments, an interconnect structure 602 covers the semiconductor substrate 106, the isolation structure 108, the silicide layers 704, the gate electrode 104, and the sidewall spacer 708. The interconnect structure 602 may include a back-end-of-line (BEOL) interconnect structure and/or a middle-end-of-line (MEOL) interconnect structure. The interconnect structure 602 comprises the ILD layer 710, one or more additional ILD layers 604, and a passivation layer 606 stacked upon one another. The additional ILD layer(s) 604 overlie the ILD layer 710, and the passivation layer 606 overlies the additional ILD layer(s) 604. The additional ILD layer(s) 604 and the passivation layer 606 may be, for example, oxide, nitride, a low κ dielectric, some other dielectric, or a combination of the foregoing.

The interconnect structure 602 further comprises the contact vias 712, as well as a plurality of wires 608 and a plurality of inter-wire vias 610, stacked within the ILD layer 710, the additional ILD layer(s) 604, and the passivation layer 606. The wires 608 and the inter-wire vias 610 may be, for example, tungsten, copper, aluminum copper, aluminum, some other conductive material, or a combination of the foregoing.

As illustrated by the cross-sectional view 800 of FIG. 8, in some embodiments, the resistive protection layer 714 covers the pair of the recess regions 118. The resistive protection layer 714 may be disposed directly on the device region 112 under the recess regions 118. The resistive protection layer 714 may extend upwardly along a sidewall of the gate electrode 104 and the gate dielectric layer 102, and may further extend laterally on a portion of an upper surface of the gate electrode 104. The sidewall spacer 708 may be disposed along sidewalls of the gate electrode 104 and the gate dielectric layer 102, and the resistive protection layer 714 may be disposed along and directly contact the sidewall spacer 708. The resistive protection layer 714 may extend laterally and overlap the isolation structure 108 and/or some portions of the gate electrode 104. Further, in some embodiments, the doping well 702 extends continuously respectively from and to opposite sides of the device region 112 of the semiconductor substrate 106.

As illustrated by the cross-sectional view 900 of FIG. 9, in some embodiments, one of the contact vias 712 extends through the ILD layer 710 to the gate electrode 104. In some embodiments, the sidewall spacer 708 is on opposite sidewalls of the gate electrode 104 and the gate dielectric layer 102.

As illustrated by the cross-sectional view 1000 of FIG. 10, in some embodiments, a plurality of the contact vias 712 (also see FIG. 6) extends through the ILD layer 710 to one of the source/drain regions 114. Further, in some embodiments, the resistive protection layer 714 is on opposite sides of the gate electrode 104 and the gate dielectric layer 102 that are in the recess regions 118. In some embodiments, the resistive protection layer 714 may be disposed on and along opposite sidewalls of the sidewall spacer 708 alongside the gate electrode 104 and the gate dielectric layer 102. The resistive protection layer 714 may extend laterally to cover a portion of an upper surface or the top surface of the gate electrode 104. The resistive protection layer 714 may extend continuously to cover an upper surface or the top surface of the device region 112 directly under the recess regions 118. By having the resistive protection layer 714 covering portions of the device region 112 underlying the recess regions 118, the portions of the device region 112 is protected from manufacturing processes thereafter, for example, the silicidation or metallization processes.

With reference to FIGS. 11-34, a series of views 1100-3400 of a method for manufacturing a transistor device with a recessed gate structure is provided according to some embodiments. The transistor device may, for example, be any of the transistor device described above associated with FIGS. 1-10.

Figure 11:
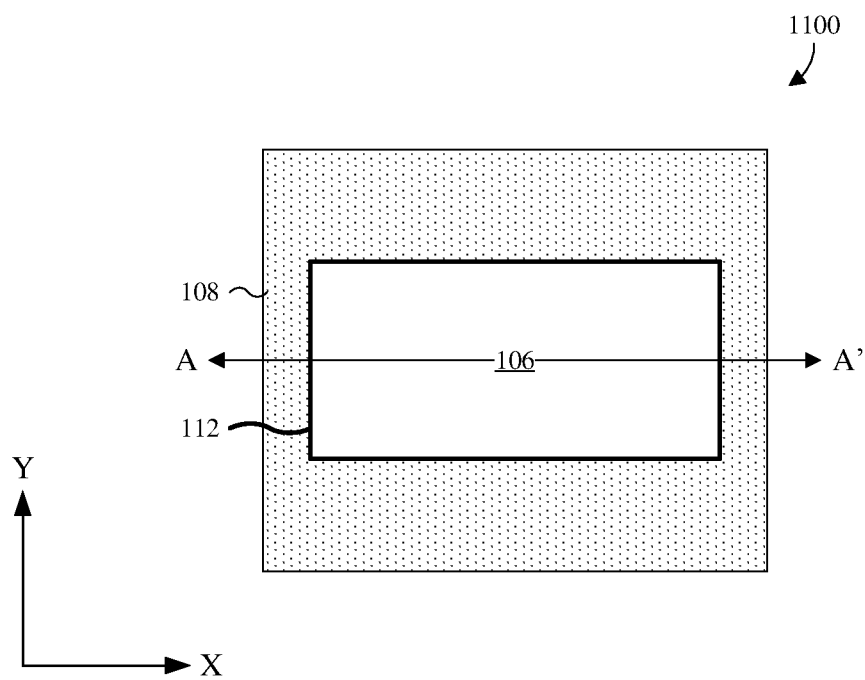
Figure 12:
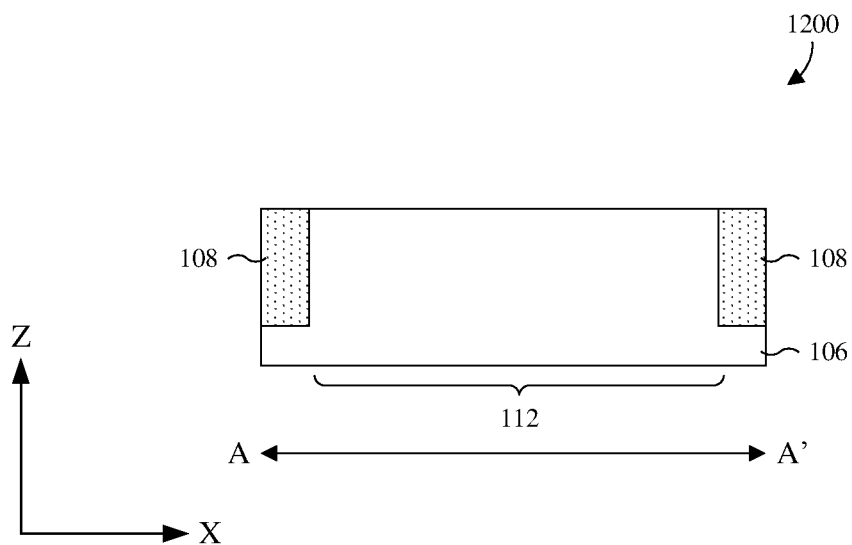

As illustrated by the top view 1100 of FIG. 11 and the cross-sectional view 1200 of FIG. 12 along line A-A' of FIG. 11, an isolation structure 108 is formed over the semiconductor substrate 106, sunken into a top of the semiconductor substrate 106. Further, the isolation structure 108 is formed demarcating a device region 112 of the semiconductor substrate 106. In some embodiments, the device region 112 of the semiconductor substrate 106 has a square or rectangular layout. The isolation structure 108 may be, for example, an STI or DTI region. The semiconductor substrate 106 may be, for example, a bulk substrate of monocrystalline or polycrystalline silicon or some other type of semiconductor substrate and may include varies doping wells and dielectric layers. In some embodiments, a process for forming the isolation structure 108 comprises performing an etch into the semiconductor substrate 106 to form a trench in the semiconductor substrate 106, and subsequently filling the trench with a dielectric material. The trench may, for example, be formed with the desired layout of the isolation structure. The dielectric material may be, for example, silicon dioxide.

Figure 13:
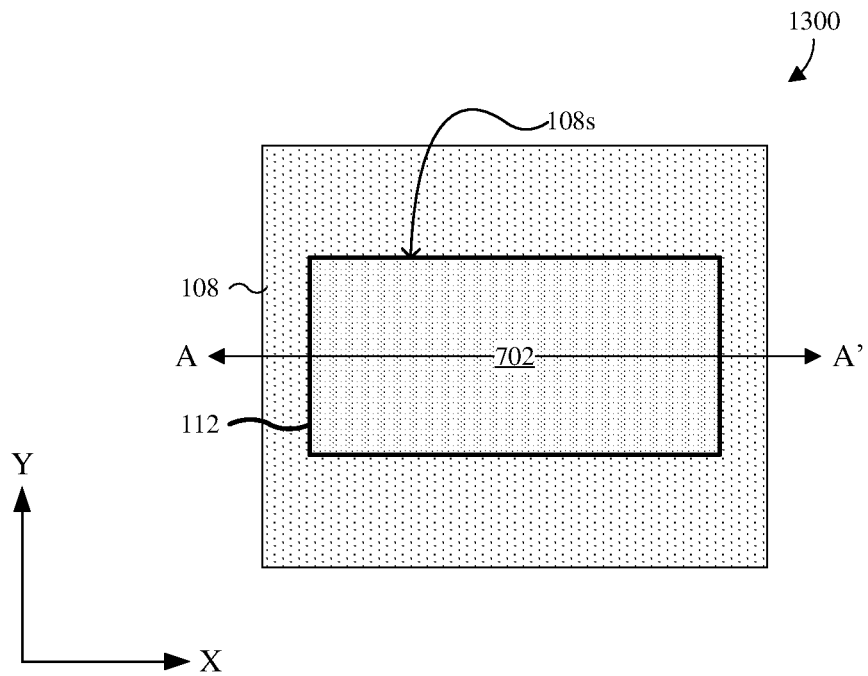
Figure 14:
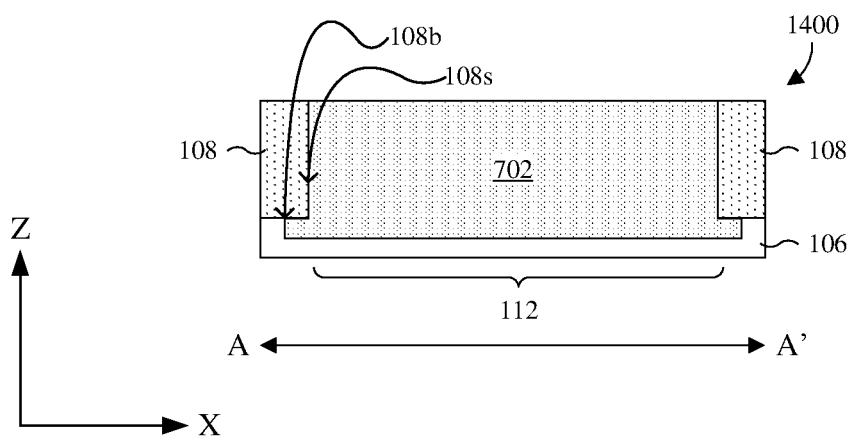

As illustrated by the top view 1300 of FIG. 13 and the cross-sectional view 1400 of FIG. 14 along line A-A' of FIG. 13, in some embodiments, a doping well 702 is formed in the device region 112 of the semiconductor substrate 106. The doping well 702 is an upper region of the semiconductor substrate 106 having an n-type doping or a p-type doping. Further, in some embodiments, the doping well 702 has a doping type opposite that of adjoining regions of the semiconductor substrate 106, or the adjoining regions of the semiconductor substrate 106 are intrinsic. The doping well 702 may, for example, be formed by ion implantation. The doping well 702 may be formed contacting an inner sidewall 108s of the isolation structure 108. The doping well 702 may extend downwardly to a position lower than a bottom surface 108b of the isolation structure 108 and may also contact an inner portion of the bottom surface 108b of the isolation structure 108.

Figure 15:
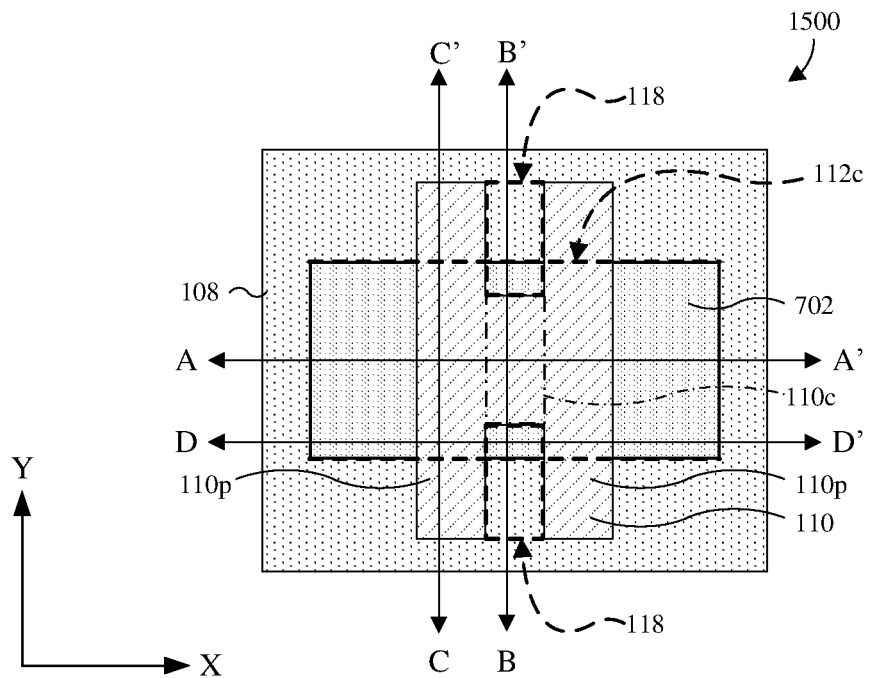
Figure 16:
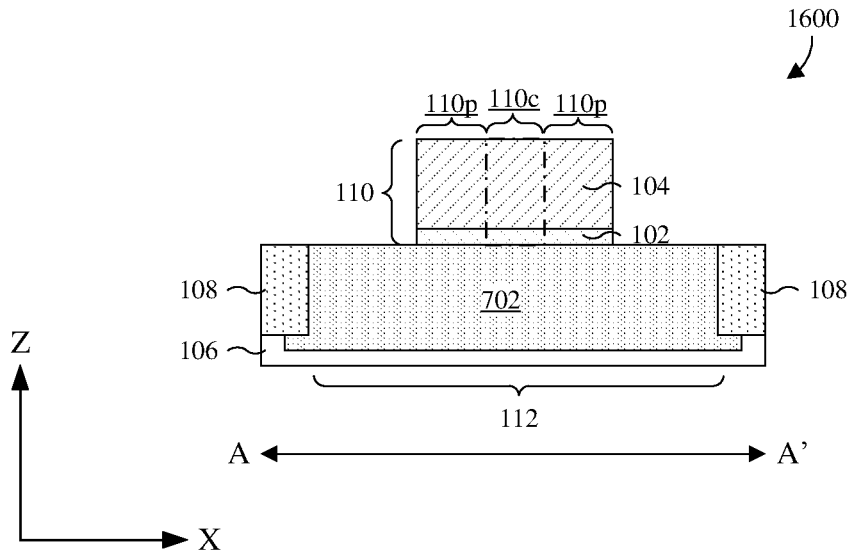
Figure 17:
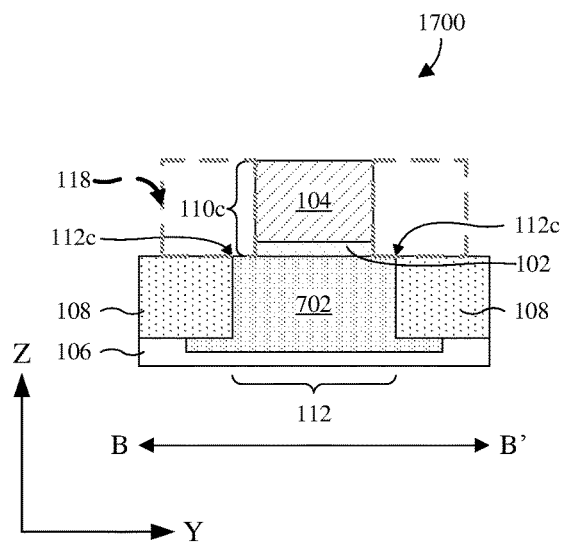
Figure 18:
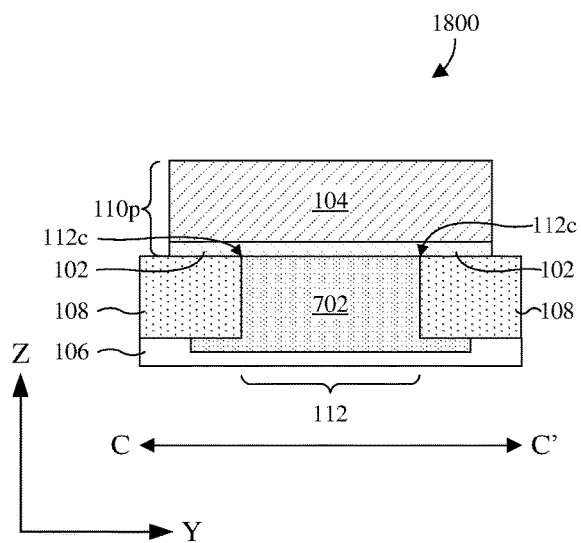
Figure 19:
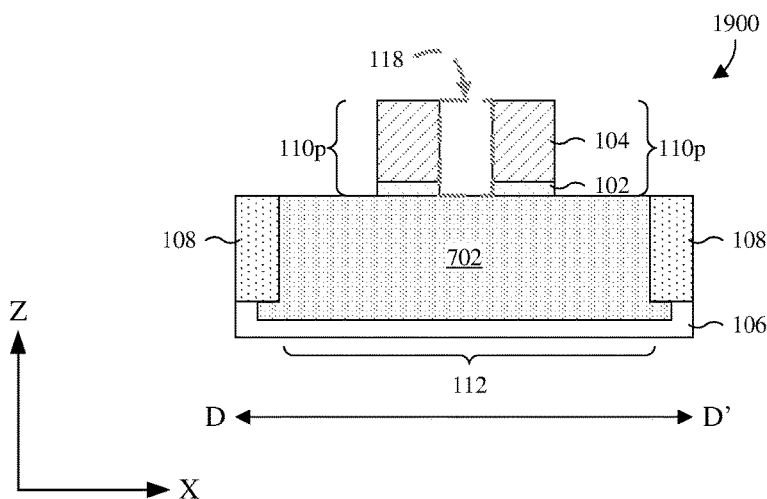

As illustrated by the views by the top view 1500 of FIG. 15, the cross-sectional view 1600 of FIG. 16 along line A-A' of FIG. 15, the cross-sectional view 1700 of FIG. 17 along line B-B' of FIG. 15, the cross-sectional view 1800 of FIG. 18 along line C-C' of FIG. 15, and the cross-sectional view 1900 of FIG. 19 along line D-D' of FIG. 15, a gate structure 110 is formed on the isolation structure 108 and the device region 112 of the semiconductor substrate 106. The gate structure 110 may comprise a gate electrode 104 stacked on a gate dielectric layer 102 and separated from the semiconductor substrate 106 by the gate dielectric layer 102. The gate dielectric layer 102 and the gate electrode 104 may be respectively formed by depositing and patterning a dielectric layer and a conductive layer on the dielectric layer. The dielectric layer may, for example, be silicon dioxide, a high κ dielectric, or some other dielectric. The conductive layer may be, for example, metal, doped polysilicon, or some other conductive. The dielectric layer may, for example, be deposited or grown by thermal oxidation, chemical or physical vapor deposition, sputtering, or some other deposition or growth process. The conductive layer may, for example, be deposited or grown by electrochemical plating, chemical or physical vapor deposition, sputtering, some other deposition or growth process. A process for patterning the conductive layer and the dielectric layer to form the gate electrode 104 and the gate dielectric layer 102 comprises forming a patterned photoresist layer on the conductive layer. The patterned photoresist layer may, for example, be formed by a spin on process. The patterned photoresist layer may, for example, be patterned with a layout of the gate electrode 104 and may, for example, be patterned using photolithography. Further, in some embodiments, the process comprises performing an etch into the conductive layer and the dielectric layer with the patterned photoresist layer in place, and subsequently stripping the patterned photoresist layer. In some embodiments, the gate dielectric layer 102 comprises a high κ dielectric material and the gate electrode 104 comprises metal.

Further, a pair of recess regions 118 is formed on opposite sides of the gate structure 110. The pair of recess regions 118 respectively overlies an interface region 112c of the the device region 112 and the isolation structure 108. The interface region 112c borders the isolation structure 108 in the device region 112 and adjoins the gate structure 110. Further, the interface region 112c may comprise a pair of lines extending laterally in parallel in the X direction. The gate structure 110 extends laterally across the pair of lines of the interface region 112c in the Y direction perpendicular to or substantially perpendicular to the X direction, from a first end of the gate structure 110 to a second end of the gate structure 110 opposite the first end. The recess regions 118 extend respectively from positions inside the device region 112 to the first and second ends of the gate structure 110, thus the gate structure 110 has a portion cut off from the interface region 112c.

In some embodiments, the gate structure 110 has an H-shaped layout, as shown by the top view 1500 of FIG. 15. In some embodiments, the gate structure 110 has an X-shaped layout, or other applicable layouts that comprise recess regions in opposite ends in the Y direction, such as a layout with curved recess regions as shown by FIG. 1B. Further, in some embodiments, the gate structure 110 has a pair of peripheral gate segments 110p and a central gate segment 110c. The peripheral and central gate segments 110p, 110c may be line shaped or with curved ends or sidewalls as discussed above. The peripheral gate segments 110p extend laterally in parallel in the Y direction, from the first end of the gate structure 110 to the second end of the gate structure 110. Further, the peripheral gate segments 110p respectively cover the interface region 112c, as shown by the top view 1500 of FIG. 15 and the the cross-sectional view 1800 of FIG. 18 along line C-C' of FIG. 15. The central gate segment 110c is between the peripheral gate segments 110p, and extends laterally in the X direction from one of the peripheral gate segments 110p to another one of the peripheral gate segments 110p as shown by the top view 1500 of FIG. 15 and the cross-sectional view 1600 of FIG. 16 along line A-A' of FIG. 15. The central gate segment 110c overlies an inner region of the device region 112 and does not compass the interface region 112c, as shown by the top view 1500 of FIG. 15 and the cross-sectional view 1700 of FIG. 17 along line B-B' of FIG. 15. The disclosed formation method of the recessed gate structure 110 is a low cost, low complexity process because the recess regions 118 are formed as a result of an improved gate layout without involving additional masking process.

Figure 20:
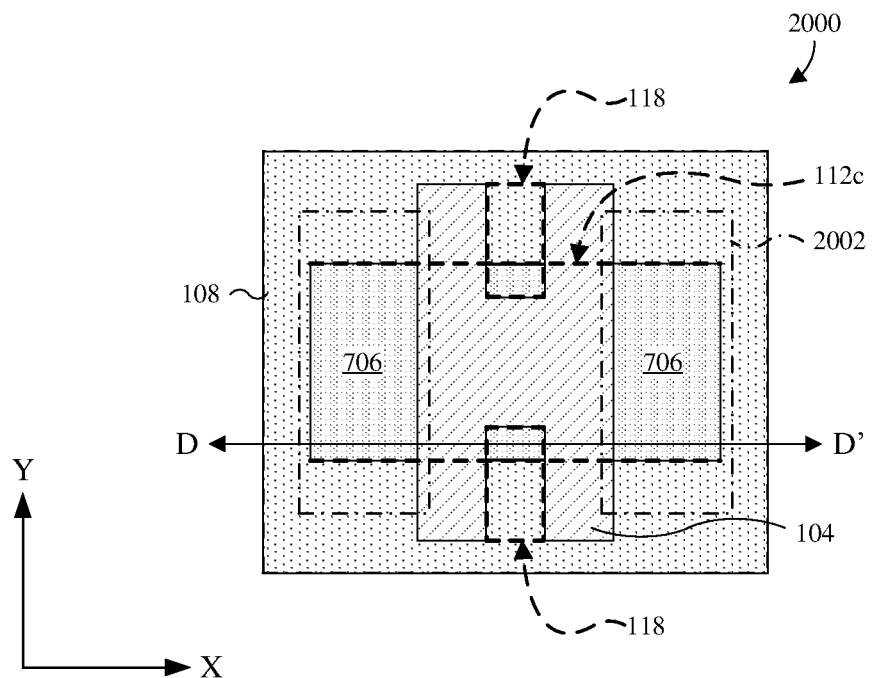
Figure 21:
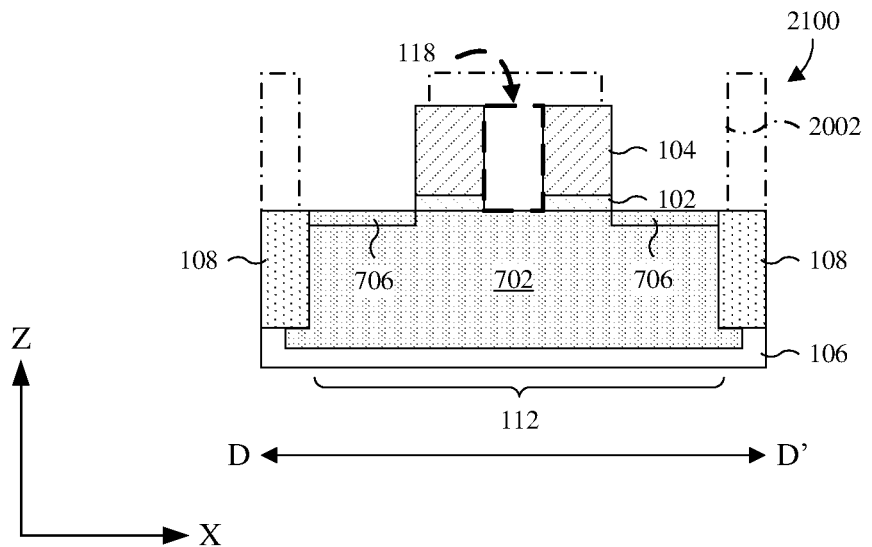

As illustrated by the top view 2000 of FIG. 20 and the cross-sectional view 2100 of FIG. 21 along line D-D' of FIG. 20, in some embodiments, a pair of lightly-doped drain (LDD) extensions 706 is formed in the device region 112 of the semiconductor substrate 106. The LDD extensions 706 are respectively formed in the device region 112 of the semiconductor substrate 106 and laterally spaced from one another in a first direction on opposite sides of the gate structure 110. In some embodiments, the LDD extensions 706 are formed by an ion implantation process. A masking layer 2002 may be used to cover and protect remaining regions of the structure while to leave openings corresponding to the LDD extensions 706 to be formed. The LDD extensions 706 may, for example, be doped regions of the semiconductor substrate 106 with an opposite doping type as the doping well 702. The ion implantation process or other doping process used for the formation of the LDD extensions 706 does not dope the recess regions 118.

Figure 22:
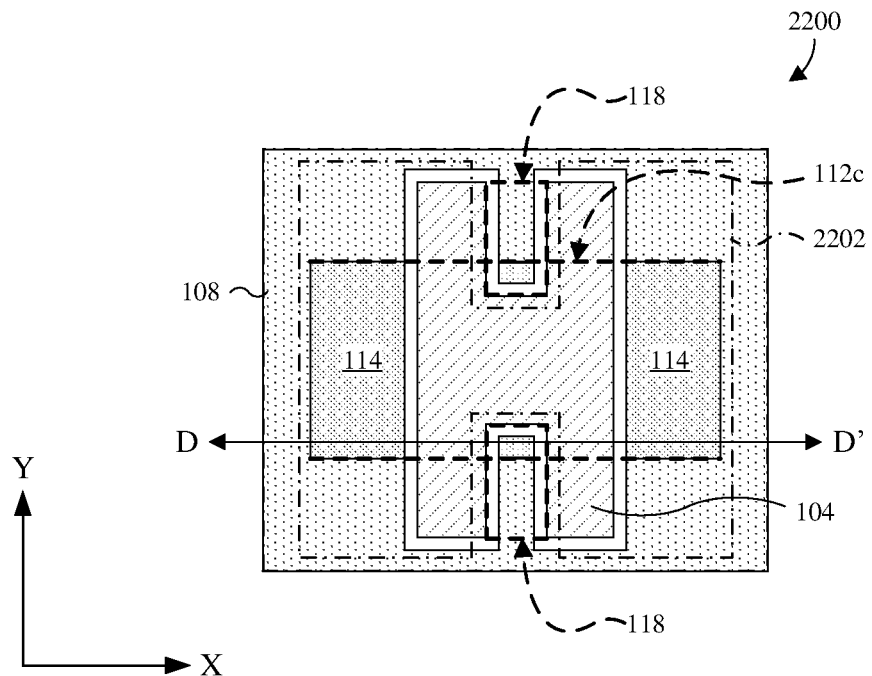
Figure 23:
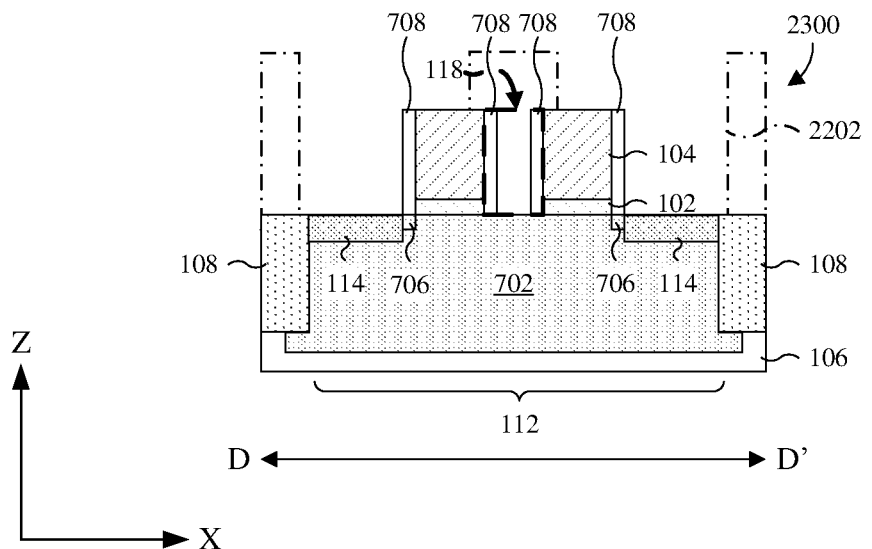

As illustrated by the top view 2200 of FIG. 22 and the cross-sectional view 2300 of FIG. 23 along line D-D' of FIG. 22, in some embodiments, a sidewall spacer 708 is formed along sidewalls of the gate structure 110 including the gate electrode 104 and the gate dielectric layer 102. The sidewall spacer 708 may be formed completely enclosing the gate electrode 104 and the gate dielectric layer 102. Further, in some embodiments, the sidewall spacer 708 covers sidewalls of the gate electrode 104 and the gate dielectric layer 102 in the recess regions 118. The sidewall spacer 708 may, for example, be silicon nitride, silicon dioxide, some other dielectric, or a combination of the foregoing. In some embodiments, a process for forming the sidewall spacer 708 comprises depositing or growing a spacer layer covering and conformally lining the structure in FIGS. 20-21. The spacer layer may, for example, be deposited or grown by chemical or physical vapor deposition, sputtering, or some other deposition or growth process. Further, in some embodiments, the process comprises performing an etch back into the spacer layer to remove horizontal segments of the spacer layer without removing vertical segments of the spacer layer. A remaining vertical segment corresponds to the sidewall spacer 708.

Still as illustrated by the views 2200-2300 of FIGS. 22-23, a pair of source/drain regions 114 are formed in the device region 112 of the semiconductor substrate 106. The source/drain regions 114 are formed laterally spaced from one another in the first direction on opposite sides of the gate structure 110. In some embodiments, the source/drain regions 114 respectively adjoin the LDD extensions 706. The source/drain regions 114 may, for example, be regions of the semiconductor substrate 106 with an opposite doping type as the doping well 702. Further, the source/drain regions 114 may, for example, have the same doping type (e.g., p-type or n-type) as the LDD extensions 706 and/or a higher doping concentration than the LDD extensions 706. In some embodiments, the source/drain regions 114 are formed by ion implantation or other applicable doping techniques. A masking layer 2202 may be used to cover and protect remaining regions of the structure while to leave openings corresponding to the source/drain regions 114 to be formed. In some embodiments, the masking layer 2202 may also expose a major portion of the gate structure 110 for the ion implantation process or other doping processes used for the formation of the source/drain regions 114. However, a boundary portion of the gate structure 110 is covered to protect the recess regions 118 from doping by the ion implantation process or other doping process used for the formation of the source/drain regions 114.

As illustrated by the top view 2400 of FIG. 24 and the cross-sectional view 2500 of FIG. 25 along line D-D' of FIG. 24 and the cross-sectional view 2600 of FIG. 26 along line B-B' of FIG. 24, in some embodiments, a resistive protection layer 714 is formed and patterned to cover the recess regions 118. In some embodiments, the resistive protection layer 714 may directly contact a top surface of the interface region 112c and adjoining device regions 112 and the isolation structure 108. The resistive protection layer 714 may, for example, be silicon nitride, silicon dioxide, some other dielectric, or a combination of the foregoing. The resistive protection layer 714 may be formed by a deposition process of a dielectric material followed by a patterning process. The patterning process of the resistive protection layer 714 has a relaxed margin requirement: the formed resistive protection layer 714 may not need to cover the whole recess regions 118 or may extend upwardly and cover a boundary portion of the top surface of the gate structure 110. Thus, the resistive protection layer 714 may have an ending sidewall disposed on the top surface of the gate structure 110 according to some embodiments. By having the resistive protection layer 714 covering portions of the device region 112 underlying the recess regions 118, the portions of the device region 112 is protected from manufacturing processes followed. For example, the portions of the device region 112 are protected from a silicidation or metallization process described below associated with FIGS. 27-29.

As illustrated by the top view 2700 of FIG. 27 and the cross-sectional view 2800 of FIG. 28 along line D-D' of FIG. 27 and the cross-sectional view 2900 of FIG. 29 along line B-B' of FIG. 27, in some embodiments, a silicidation or metallization process is performed to form conductive regions for contacting. For example, a pair of silicide layers 704 may be respectively formed in an upper portion of the source/drain regions 114. Further, in some embodiments, a silicide layer 716 is formed on the gate electrode 104. The silicide layers 704, 716 may, for example, be nickel silicide, titanium silicide, cobalt silicide, platinum silicide, tungsten silicide, or some other transition metal silicide. In some embodiments, a process for forming the silicide layers 704, 716 comprises depositing a transition metal layer covering the structure of FIGS. 24-26, and subsequently heating the transition metal layer so it reacts with exposed silicon to form the silicide layers 704, 716. Further, in some embodiments, the process comprises removing unreacted material of the transition metal layer by an etch. The process may, for example, be a self-aligned process. The resistive protection layer 714 covers the portions of the device region 112 underlying the recess regions 118 to protect that portions of the device region 112 from metallization. In some embodiments, the resistive protection layer 714 extends upwardly to cover portions of the gate electrode 104 adjoining the recess regions 118, and the silicide layer 716 does not extend on the portions of the gate electrode 104 covered by the resistive protection layer 714.

Figure 30:
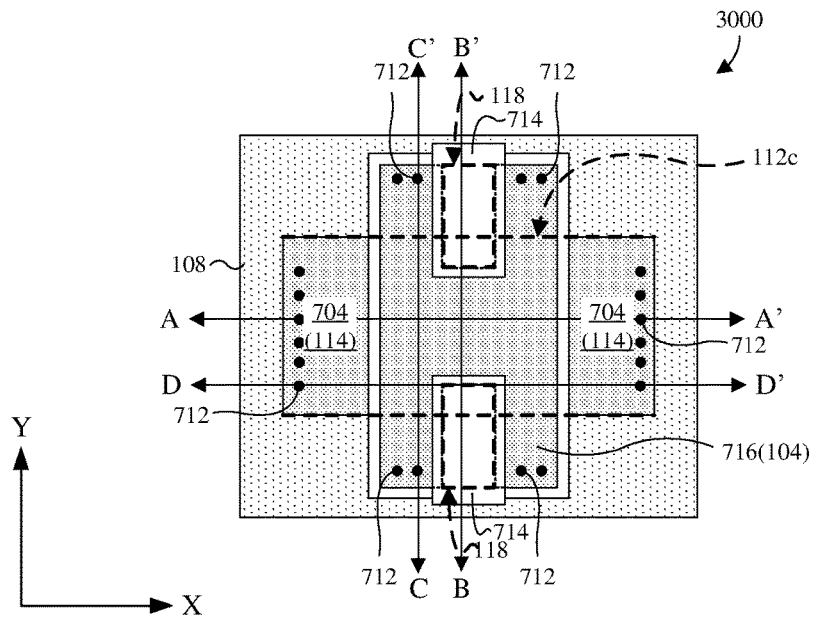
Figures 31, 32:
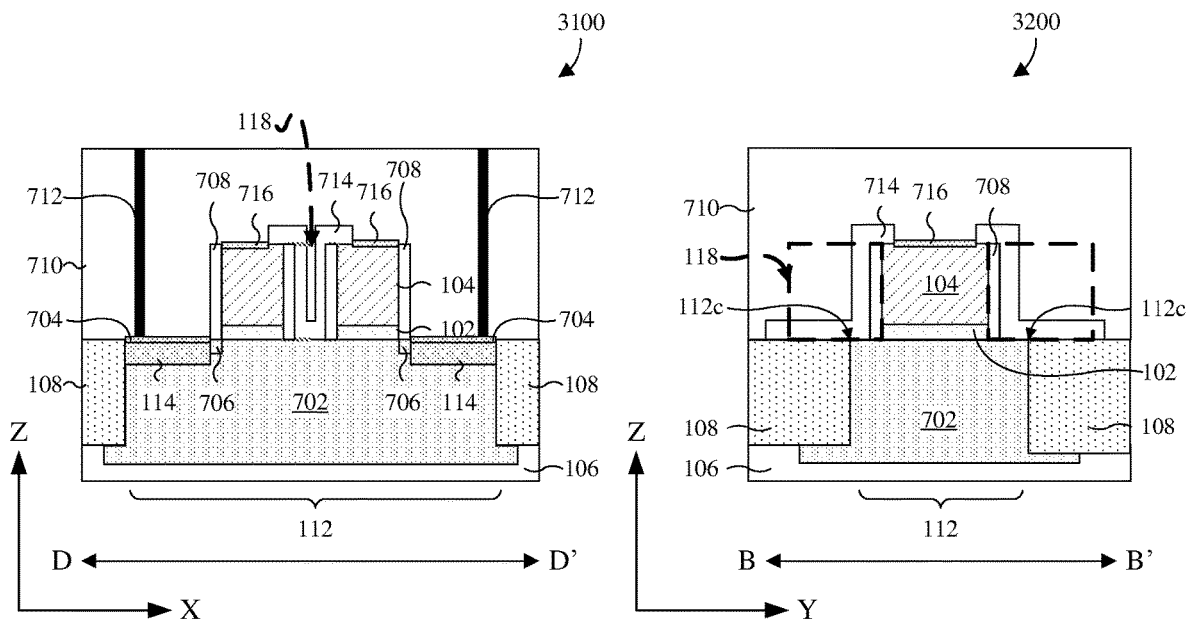
Figure 33:
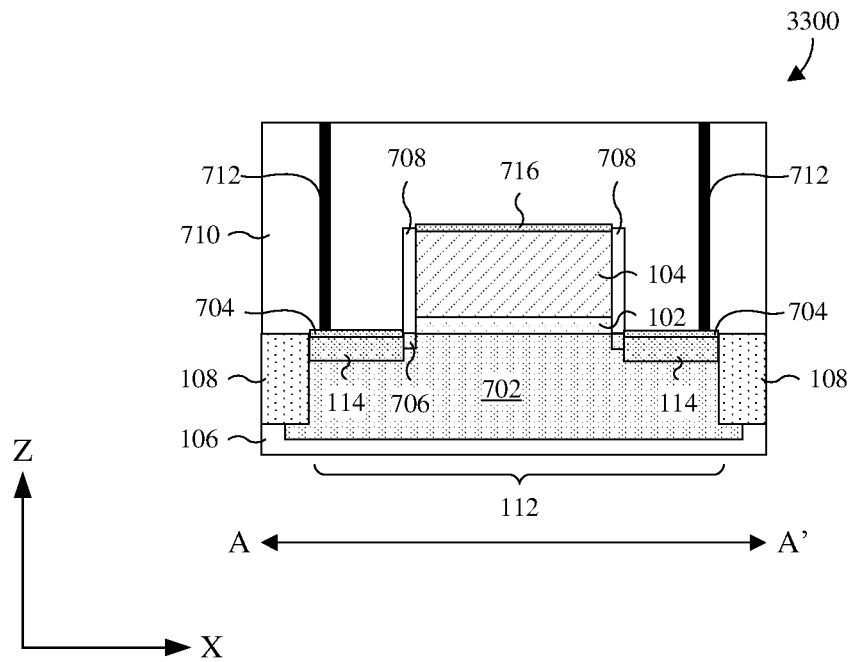
Figure 34:
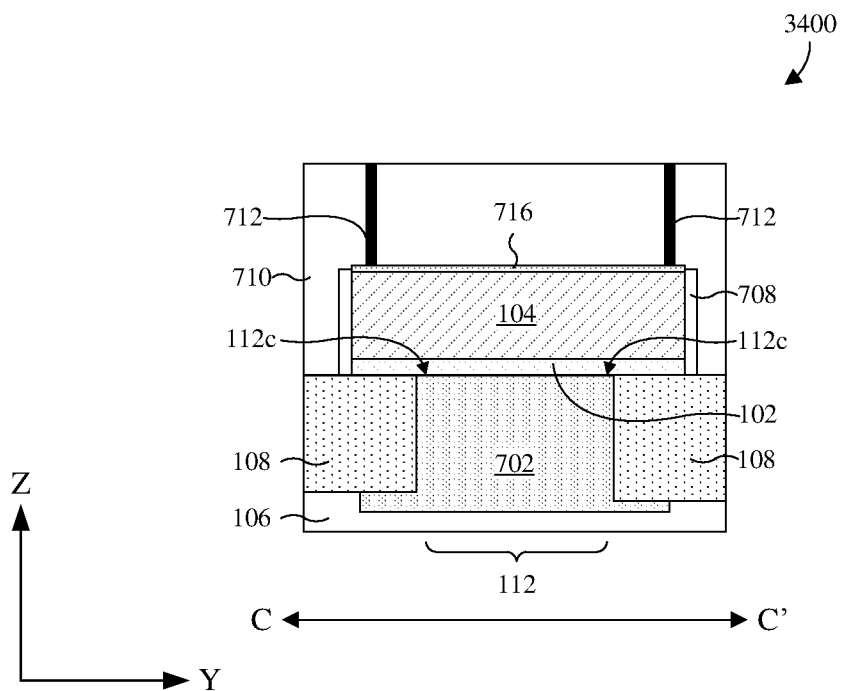

As illustrated by the top view 3000 of FIG. 30 and the cross-sectional view 3100 of FIG. 31 along line D-D' of FIG. 30, the cross-sectional view 3200 of FIG. 32 along line B-B' of FIG. 30, the cross-sectional view 3300 of FIG. 33 along line A-A' of FIG. 30, and the cross-sectional view 3400 of FIG. 34 along line C-C' of FIG. 30, an interlayer dielectric (ILD) layer 710 is formed covering the structure of FIGS. 27-29. The ILD layer 710 may, for example, be formed with a planar top surface, and/or may, for example, be formed of oxide, nitride, a low κ dielectric, some other dielectric, or a combination of the foregoing. In some embodiments, a process for forming the ILD layer 710 comprises depositing or growing the ILD layer 710 covering the structure of FIGS. 27-29, and subsequently performing a planarization into the ILD layer 710. The depositing or growing may, for example, be formed by chemical or physical vapor deposition, sputtering, some other deposition or growth process, or a combination of the foregoing. The planarization may, for example, be performed by chemical mechanical polishing (CMP).

Also illustrated by the views 3000-3400 of FIGS. 30-34, contact vias 712 are formed extending through the ILD layer 710 to the source/drain regions 114 and/or the silicide layers 704. The silicide layers 704 facilitate ohmic contacts between the contact vias 712 and the source/drain regions 114. Further, the contact vias 712 are formed extending through the ILD layer 710 to the gate electrode 104 and/or an additional silicide layer (not shown) on the gate electrode 104. In some embodiments, a process for forming the contact vias 712 comprises performing an etch into the ILD layer 710 to form contact-via openings corresponding to the contact vias 712. The etch may be, for example, performed using photolithography. Further, in some embodiments, the process comprises filling the contact-via openings with a conductive material. The conductive-via openings may, for example, be filled by depositing or growing a conductive layer covering the ILD layer 710 and filling the contact-via openings, and subsequently performing a planarization into the ILD layer and the conductive layer. The planarization may, for example, be performed by CMP. The process may, for example, be part of a single damascene like process or a dual damascene like process.

While not shown, additional dielectric layers and conductive features may be subsequently formed stacked on the ILD layer 710. Examples of such additional dielectric layers and conductive features are shown in FIG. 7. For example, one or more additional ILD layers 604 and a passivation layer 606 in FIG. 7 may be formed stacked on the ILD layer 710, and wires 608 and inter-wire vias 610 in FIG. 7 may be formed stacked on the ILD layer 710.

Figure 35:
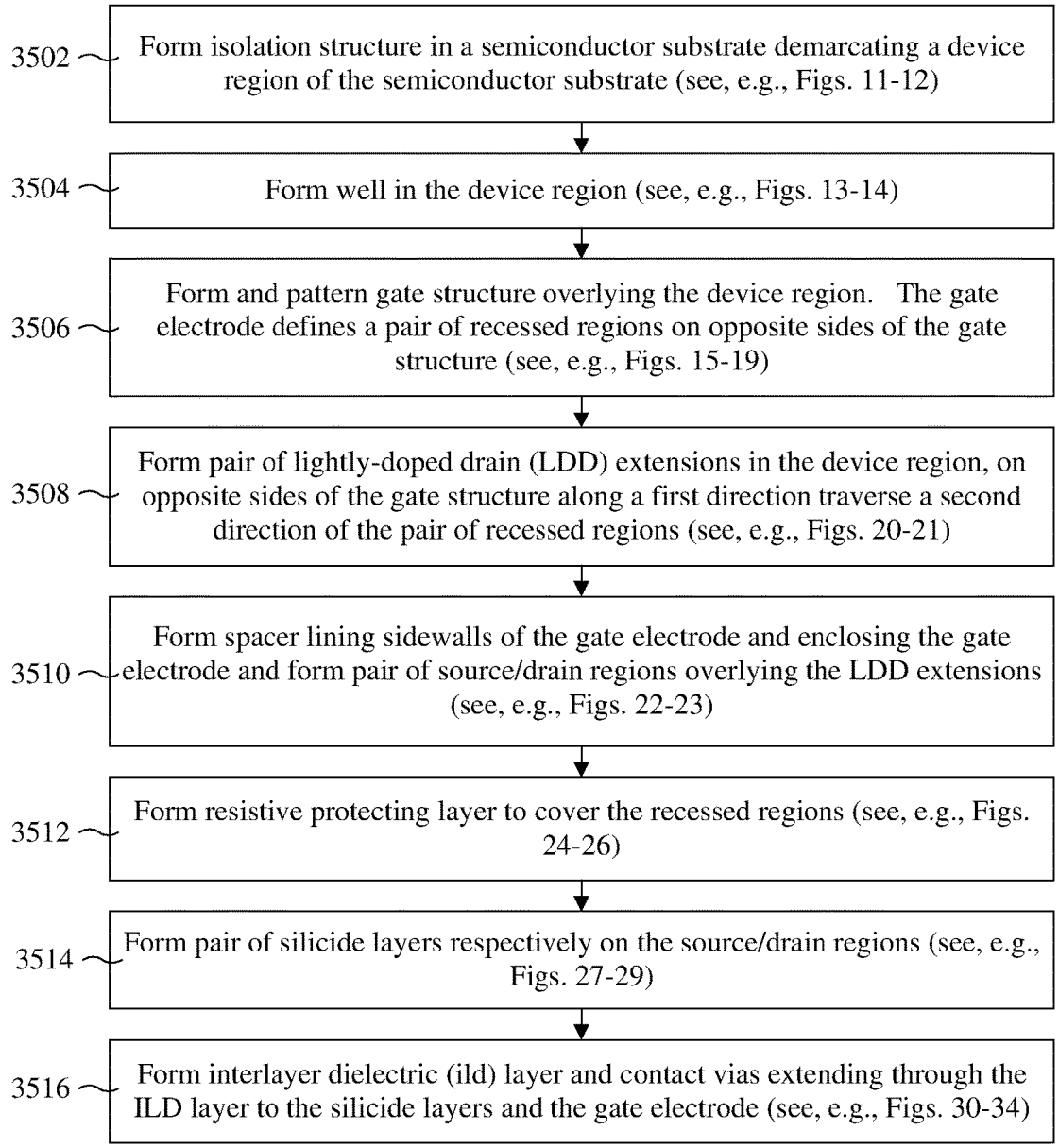
FIG. 35 illustrates a flow diagram of a method for manufacturing a transistor device with a recessed gate structure.

FIG. 35 illustrates a flow diagram of a method 3500 of manufacturing a transistor device with a recessed gate structure according to some embodiments. While disclosed method 3500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. FIG. 35 may illustrate some embodiments of the method disclosed by FIGS. 11-34.

At act 3502, an isolation structure is formed in a semiconductor substrate. The isolation structure demarcates a device region of the semiconductor substrate. An interface region of the device region and the isolation structure comprises a pair of lines that extend in parallel in a first direction. FIGS. 11-12 illustrate the top view 1100 and the cross-sectional view 1200 corresponding to some embodiments corresponding to act 3502.

At act 3504, in some embodiments, a well is formed in the device region. FIGS. 13-14 illustrate the top view 1300 and the cross-sectional view 1400 corresponding to some embodiments corresponding to act 3504.

At act 3506, a gate structure is formed and patterned overlying the device region and the isolation structure, where a planar layout of the gate structure defines a pair of recess regions respectively on the first and second ends of the gate structure along a second direction transverse to the first direction. The recess regions overlie the pair of lines of the interface region. FIGS. 15-19 illustrate the top view 1500 and the cross-sectional views 1600-1900 corresponding to some embodiments corresponding to act 3506.

At act 3508, in some embodiments, a pair of LDD extensions is formed in the device region, respectively through the recess regions, where the LDD extensions are laterally spaced on opposite sides of the gate structure in the first direction. FIGS. 20-21 illustrate the top view 2000 and the cross-sectional view 2100 corresponding to some embodiments corresponding to act 3508.

At act 3510, a spacer is formed lining sidewalls of the gate structure and enclosing the gate structure. Then, a pair of source/drain regions is formed in the device region and respectively overlapping the LDD extensions. FIGS. 22-23 illustrate the top view 2200 and the cross-sectional view 2300 corresponding to some embodiments corresponding to act 3510.

At act 3512, a resistive protection layer is formed and patterned to cover the recess regions. In some embodiments, the resistive protection layer may directly contact a top surface of the interface region. The resistive protection layer covers the device region underneath the recess regions. FIGS. 24-26 illustrate the top view 2400 and the cross-sectional views 2500-2600 corresponding to some embodiments corresponding to act 3512.

At 3514, in some embodiments, a pair of silicide layers is formed respectively on the source/drain regions. FIGS. 27-29 illustrate the top view 2700 and the cross-sectional views 2800-2900 corresponding to some embodiments corresponding to act 3514.

At 3516, an ILD layer is formed covering the source/drain regions, the isolation structure, the semiconductor substrate, and the gate structure. Also, a plurality of contact vias is formed extending through the ILD layer to the silicide layers and the gate structure. FIGS. 30-34 illustrate the top view 3000 and the cross-sectional views 3100-3400 corresponding to some embodiments corresponding to act 3516.

Thus, in some embodiments, the present application provides a method to form a transistor device. The method comprises forming an isolation structure in a semiconductor substrate enclosing a device region and forming a device doping well in the device region. The method further comprises forming a gate structure overlying the device region and the isolation structure. The gate structure separates the device doping well along a first direction and comprises a pair of recess regions disposed on opposite sides of the device region in a second direction perpendicular to the first direction. The method further comprises forming a pair of source/drain regions in the device region on opposite sides of the gate structure. The method further comprises forming a sidewall spacer extending along sidewalls of the gate structure, where a top surface of the sidewall spacer is substantially flush with the top surface of the gate structure, and forming a resistive protection layer on the sidewall spacer and covering the pair of recess regions.

In other embodiments, the present disclosure provides another embodiment of a method forming a transistor device. The method comprises forming an isolation structure in a semiconductor substrate surrounding a device region and forming a gate structure on the device region with a gate dielectric layer separating a gate electrode from the device region. The gate structure is formed with a pair of recess regions respectively overly an interface region of the isolation structure and the device region. The gate electrode forms an 'H' shape when viewed on a face of the gate structure. The method further comprises forming a sidewall spacer outlining the 'H' shape, extending from the isolation structure up to a top surface that is flush with a top surface of the gate structure, and forming a pair of source/drain regions in the device region on opposite sides of the gate structure and laterally spaced apart by a channel region. The channel region has a channel length extending along a first direction from one of the source/drain regions to the other one of the source/drain regions, wherein the channel region has a channel width extending along a second direction perpendicular to the first direction from one of the recess regions to the other one of the recess regions.

In yet other embodiments, the present application provides a method for manufacturing a transistor device. An isolation structure is formed in a semiconductor substrate, and the isolation structure demarcates a device region of the semiconductor substrate. A gate structure is formed overlying the device region of the semiconductor substrate. The gate electrode is formed with a pair of recess regions respectively overlies an interface region of the isolation structure and the device region. A doping process is performed to the device region of the semiconductor substrate with the gate structure in place to form a pair of source/drain regions in the device region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a transistor device, comprising:
   forming an isolation structure in a semiconductor substrate enclosing a device region;
   forming a device doping well in the device region;
   forming a gate structure overlying the device region and the isolation structure, wherein the gate structure separates the device doping well along a first direction and comprises a pair of recess regions disposed on opposite sides of the device region in a second direction perpendicular to the first direction;
   forming a pair of source/drain regions in the device region on opposite sides of the gate structure;
   forming a sidewall spacer extending along sidewalls of the gate structure, where a top surface of the sidewall spacer is substantially flush with the top surface of the gate structure; and
   forming a resistive protection layer conformally covering top and sidewall surfaces of the sidewall spacer within the pair of recess regions.

2. The method according to claim 1, wherein the pair of recess regions is formed overlying an interface region of the isolation structure and the device region.

3. The method according to claim 2, wherein the resistive protection layer is formed directly contacting a top surface of the interface region.

4. The method according to claim 1,
   wherein a channel region is formed in the device region underneath the gate structure, wherein the channel region has a channel width extending in the second direction from boundaries of one of the pair of recess regions to the other one of the pair of recess regions,
   wherein the pair of source/drain regions respectively has a width in the second direction greater than the channel width.

5. The method according to claim 4, wherein the channel width is smaller than a device width of the device doping well.

6. The method according to claim 1, wherein the gate structure is formed to include a pair of peripheral gate segments on opposite sides of the pair of recess regions in the first direction.

7. The method according to claim 1, wherein the pair of recess regions is formed with a concave curved perimeter lined with the sidewall spacer and extending to an outermost sidewall of the gate structure.

8. The method according to claim 1, wherein the resistive protection layer has a bottom surface coplanar with a bottom surface of the gate structure.

9. The method according to claim 8, wherein the isolation structure is made of silicon dioxide and extends into a top of the semiconductor substrate and demarcating the device region of the semiconductor substrate.

10. The method according to claim 1, wherein the gate structure is formed to include a gate electrode on a gate dielectric layer; and wherein the gate dielectric layer has sidewalls vertically flushed with sidewalls of the gate electrode.

11. A method of forming a transistor device, comprising:
    forming an isolation structure in a semiconductor substrate surrounding a device region;
    forming a gate structure on the device region with a gate dielectric layer separating a gate electrode from the device region, wherein the gate structure is formed with a pair of recess regions respectively overly an interface region of the isolation structure and the device region, wherein the gate electrode forms an 'H' shape when viewed on a face of the gate structure; and
    forming a sidewall spacer outlining the 'H' shape, extending from the isolation structure up to a top surface that is flush with a top surface of the gate structure; and
    forming a pair of source/drain regions in the device region on opposite sides of the gate structure and laterally spaced apart by a channel region, wherein the channel region has a channel length extending along a first direction from one of the pair of source/drain regions to the other one of the pair of source/drain regions, wherein the channel region has a channel width extending along a second direction perpendicular to the first direction from one of the pair of recess regions to the other one of the pair of recess regions; and
    forming a resistive protection layer within the pair of recess regions and extending conformally to cover a portion of a top surface of the gate electrode while leaving a remaining portion of the top surface of the gate electrode uncovered by the resistive protection layer.

12. The method according to claim 11, wherein the resistive protection layer extends along a sidewall of the sidewall spacer and has a bottom surface coplanar with a bottom surface of the gate structure.

13. The method according to claim 12, wherein the resistive protection layer further extends laterally on the top surface of the sidewall spacer.

14. The method according to claim 13, wherein the resistive protection layer has a bottom surface that is laterally flush with a bottom surface of the sidewall spacer.

15. The method according to claim 11, further comprising:
    forming a
    silicide layer on the remaining portion of the top surface of the gate electrode, wherein the silicide layer is absent from the portion of the top surface of the gate electrode covered by the resistive protection layer.

16. The method according to claim 11, wherein the resistive protection layer has an ending sidewall disposed on an upper surface of the gate structure.

17. The method according to claim 11, wherein the pair of recess regions is formed on opposite sides of the channel region in the second direction.

18. The method according to claim 11, wherein the pair of recess regions is formed with a rectangular shape.

19. A method for manufacturing a transistor device, the method comprising:
    forming an isolation structure in a semiconductor substrate, wherein the isolation structure demarcates a device region of the semiconductor substrate;
    forming a gate structure overlying the device region of the semiconductor substrate, wherein the gate structure is formed with a pair of recess regions overlying an interface region of the isolation structure and the device region;

performing a doping process to the device region of the semiconductor substrate with the gate structure in place to form a pair of source/drain regions in the device region;

forming a sidewall spacer extending along sidewalls of the gate structure; and conformally forming a resistive protection layer within the pair of recess regions, extending upwardly along a sidewall of the sidewall spacer, and further extending laterally along top surfaces of the sidewall spacer and the gate structure.

20. The method according to claim 19, further comprising:

forming a silicide layer on the pair of source/drain regions and at least a portion of the gate structure not covered by the resistive protection layer, wherein the sidewall spacer has a top surface coplanar with a top surface of the gate structure.

* * * * *